(12) United States Patent
Ouyang et al.

(10) Patent No.: US 6,347,029 B1
(45) Date of Patent: Feb. 12, 2002

(54) OVER-CURRENT PROTECTION CIRCUIT FOR LINEAR VOLTAGE REGULATORS

(75) Inventors: Paul H. Ouyang, San Jose; Joseph W. Ku, Palo Alto; Donald Liusie, San Jose, all of CA (US)

(73) Assignee: Dmel, Inc., Santa Clara, CA (US)

( * ) Notice: Subject to any disclaimer, the term of this patent is extended or adjusted under 35 U.S.C. 154(b) by 0 days.

(21) Appl. No.: 09/346,608

(22) Filed: Jul. 2, 1999

(51) Int. Cl.[7] ............................. H02H 3/00; G11C 7/00
(52) U.S. Cl. .................. 361/93.9; 327/309; 365/189.09
(58) Field of Search ....................... 361/18, 93.1, 93.9, 361/98; 323/265, 282, 273, 276; 327/108, 50, 77, 309, 530, 534; 365/189.09

(56) References Cited

U.S. PATENT DOCUMENTS

| | | | | |
|---|---|---|---|---|
| 4,021,701 A | * | 5/1977 | Davies ........................ | 361/18 |
| 4,338,646 A | * | 7/1982 | Davis et al. .................. | 361/18 |
| 4,937,697 A | * | 6/1990 | Edwards et al. ............... | 361/18 |
| 5,570,060 A | * | 10/1996 | Edwards ...................... | 327/541 |
| 5,835,420 A | * | 11/1998 | Lee et al. ............... | 365/189.09 |

\* cited by examiner

Primary Examiner—Kim Huynh
(74) Attorney, Agent, or Firm—Eric Ho

(57) ABSTRACT

Current protection circuit has a comparator having a first terminal coupled to a reference voltage, a second terminal coupled to an output node, and an output for providing a control signal based on the inputs. Current protection circuit also has a transistor having a drain electrode coupled to a first predetermined voltage, a gate electrode, and a source electrode coupled to the output node. The transistor includes a current path between the drain electrode and the source electrode for conducting an amount of current that is dependent on the voltage applied to the gate electrode. Current protection circuit also has a fold-back circuit having a first input coupled to the output node for detecting changes in the output voltage, a second input coupled to the output of comparator for receiving the control signal, and a third input for selectively changing the voltage applied to the gate electrode based the control signal and the changes in the output voltage.

7 Claims, 5 Drawing Sheets

OVER-CURRENT PROTECTION CIRCUIT FOR LINEAR VOLTAGE REGULATORS

BACKGROUND OF THE INVENTION

1. Field of the Invention

The present invention relates generally to linear voltage regulators and specifically to an over-current protection circuit for linear voltage regulators.

2. Background of the Invention

Linear voltage regulators are well known and useful circuits for providing regulation for a load device that draws a changing amount of load current. For example, load regulation maintains a nearly constant output voltage even when the load current varies. In other words, linear voltage regulators provide a relatively constant DC output voltage that is independent of output load current.

FIG. 1 illustrates a conventional linear voltage regulator 2. Linear voltage regulator 2 includes a comparator 4 having a positive terminal coupled to a reference voltage, a negative terminal coupled to a $V_{OUT}$ node, and an output for providing a signal based on the comparison between the reference voltage and the voltage at the $V_{OUT}$ node. An external load 6 is coupled between the $V_{OUT}$ node and ground. External load 6 can be a computer peripheral, such as a keyboard, that has certain current and input voltage requirements.

Linear voltage regulator 2 also includes an output transistor 8. Output transistor 8 includes a drain electrode coupled to $V_{DD}$, a gate electrode coupled to the output of comparator 4, and a source electrode coupled to the $V_{OUT}$ node.

Unfortunately, the conventional linear voltage regulators suffer from several disadvantages. First, when the load for some reason draws high current through output transistor 8, the linear voltage regulator can be damaged. High current also can cause the following problems: (1) thermal run-away, (2) bondwire failure and (3) electro-migration.

Thermal run-away is an undesirable condition of semi-conductor materials and stems from the negative temperature coefficient of semi-conductor materials. A negative temperature coefficient causes the resistivity of the semi-conductor material to decrease as the temperature of the material increases. As the resistivity decreases, the current through transistors manufactured from semiconductor devices increases. For example, the increase in current in output transistor 8 correspondingly generates heat in transistor 8, thereby increasing the temperature of transistor 8. Accordingly, this vicious cycle continues and causes a "run-away" condition that causes transistor 8 to fail through excessive heat.

High current also can cause bond wire failure in at least two ways. First, the thermal run-away can cause the temperature of circuit elements, such as transistor 8, to reach such a high temperature that the bond wires connected thereto, melt and become fused. Second, high current through an internal $V_{DD}$ and ground short can fuse bond wires together. The fusing of bond wires is undesirable since signals that are designed to have differing voltage levels are corrupted by the voltage of adjacent bond wires, thereby leading to circuit failure.

High current can also cause electro-migration which can cause voids in a metal layer, such as aluminum, thereby increasing the risk of an unwanted open circuit in the current path between the $V_{DD}$ pad and the circuit.

There have been attempts to solve these problems. Unfortunately, these attempts leave much to be desired. Some of these attempts are ineffective in preventing high current conditions. Other attempts shut off the current completely, thereby causing all devices connected downstream of the current device to lose power. For example, U.S. Pat. No. 5,406,130, entitled, "Current Driver with Shutdown Circuit" discloses a shutdown circuit to address high current conditions. These prior art approaches involve complex designs and are difficult to integrate into linear regulators, thereby greatly increasing the costs to design and implement the linear voltage regulator circuit.

Furthermore, these prior art approaches fail to address the problems associated with "hot plug-in." Many computer peripheral devices are allowed to have a "hot plug-in" (i.e., the ability to connect and disconnect peripherals to the computer system when the system power is up without first powering down the system). Unfortunately, "hot plug-ins" causes a current surge in the peripheral device that draws current away from the system power. This scenario may cause the system to shut down if the protection circuit does not have a foldback feature. Un-intended system shut down is undesirable because it can cause loss of data, un-intended restart of the operating system, and other failures.

Accordingly, there remains a need for a current protection circuit for linear voltage regulators that overcomes the disadvantages set forth previously.

SUMMARY OF THE INVENTION

Accordingly, it is an object of the present invention to provide an over-current protection circuit for linear voltage regulators.

It is a further object of the present invention to provide a current protection circuit for linear voltage regulators that meets the Universal Serial Bus (USB) specification for USB load devices.

It is another object of the present invention to provide a current protection circuit for linear voltage regulators that causes the regulator to provide a fold back current upon detecting certain conditions.

In accordance with the present invention, the foregoing objects are met by providing a current protection circuit that includes a comparator having a first terminal coupled to a reference voltage, a second terminal coupled to an output node, and an output for providing a control signal based on the inputs. The current protection circuit also includes a transistor having a drain electrode coupled to a first predetermined voltage, a gate electrode, and a source electrode coupled to the output node. The transistor includes a current path between the drain electrode and the source electrode for conducting an amount of current that is dependent on the voltage applied to the gate electrode. The current protection circuit further includes a fold-back circuit having a first input coupled to the output node for detecting changes in the output voltage, a second input coupled to the output of the comparator for receiving the control signal, and a third input for selectively changing the voltage applied to the gate electrode based on the control signal and the changes in the output voltage.

DETAILED DESCRIPTION OF THE INVENTION

Figure 1:
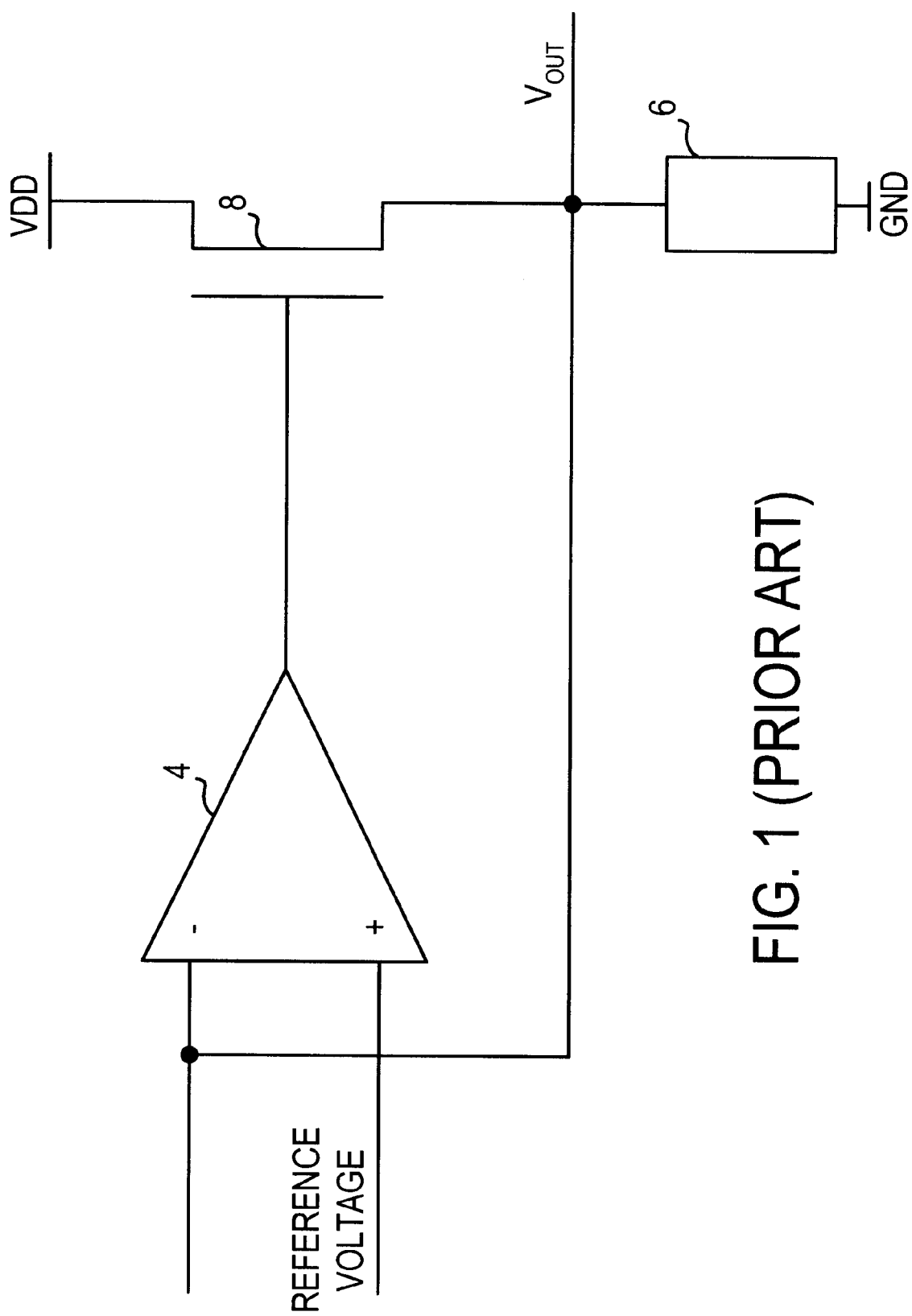
FIG. 1 illustrates a conventional linear voltage regulator.

The subject invention will be described with reference to numerous details set forth below, and the accompanying drawings will illustrate the invention. The following description and the drawings are illustrative of the invention and are not to be construed as limiting the invention. Numerous specific details are described to provide a thorough understanding of the present invention. However, in certain instances, well known or conventional circuit details are not described in order to not unnecessarily obscure the present invention in detail. In the drawings, the same element is labeled with the same reference numeral.

The present invention provides a current protection circuit that detects a high current condition and selectively places an output transistor into a low current state, thereby limiting the current flow through the output transistor to a predetermined foldback current level. Accordingly, thermal runaway of the output transistor and the fusing of bondwires are prevented.

LINEAR REGULATOR 10

Figure 2:
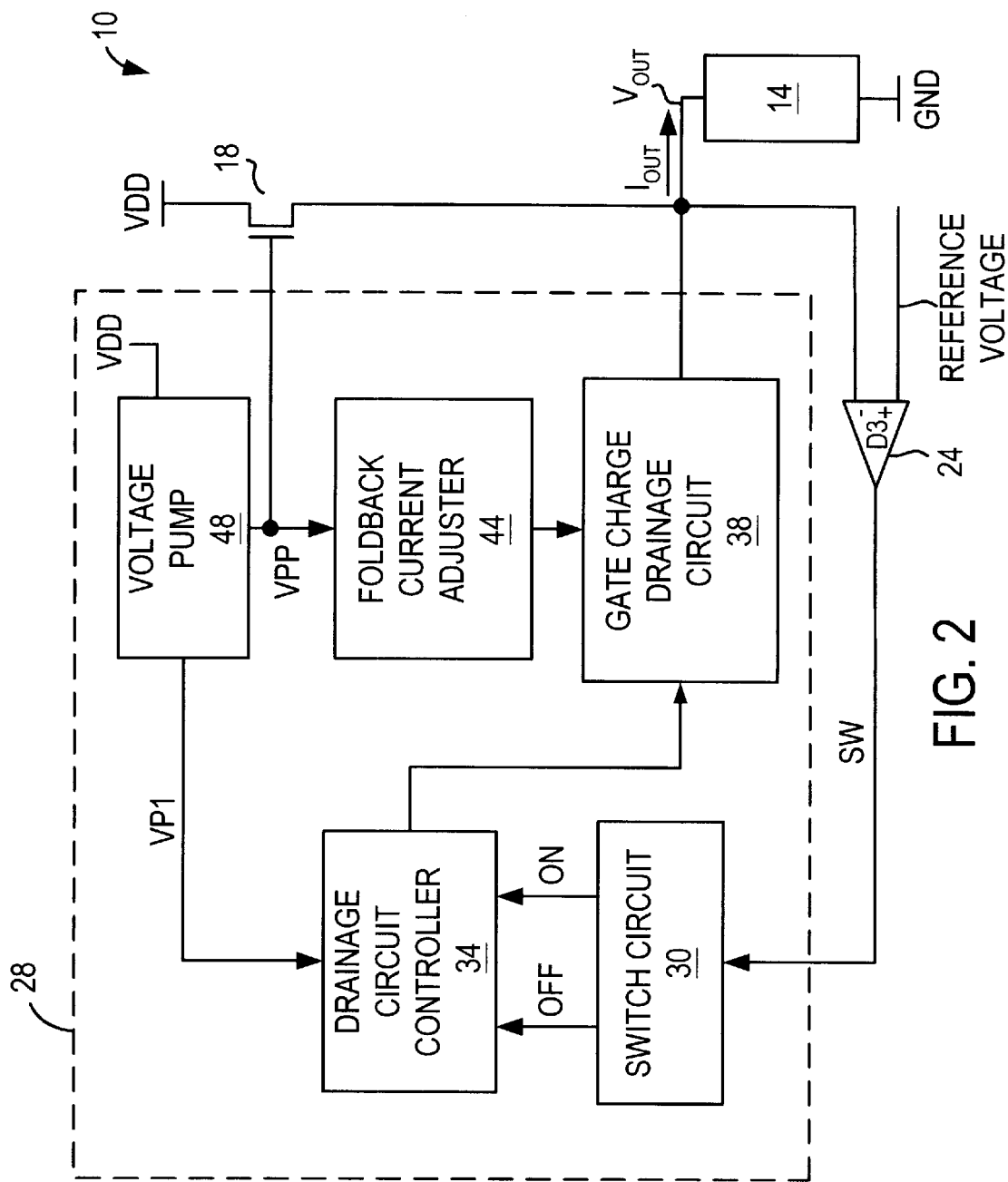
FIG. 2 is a block diagram of a linear voltage regulator having a current protection circuit configured in accordance with one embodiment of the present invention.

FIG. 2 is a block diagram illustrating a linear voltage regulator 10 that utilizes a current protection circuit 28 configured in accordance with one embodiment of the present invention.

Linear voltage regulator 10 is coupled to an external load 14 that has a first input coupled to a $V_{OUT}$ node and a second input coupled to a ground potential. Linear voltage regulator 10 regulates the amount of output voltage ($V_{OUT}$) and output current ($V_{OUT}$) provided to load 14.

External load 14 can represent the load of a peripheral device. For example, external load 14 can be, but is not limited to, a mouse, a keyboard, a joystick, a digital camera, a printer, a scanner, and speakers. The resistance of these devices varies. For example, whereas a keyboard can have an equivalent load resistance of 50 ohms, a printer or scanner typically has a smaller equivalent load resistance, such as 8 ohms.

Linear voltage regulator 10 includes an output transistor 18 that has a drain electrode coupled to a first power voltage (e.g., $V_{DD}$), a gate electrode, and a source electrode coupled to the $V_{OUT}$ node.

Linear regulator 10 also includes a comparator 24 that has a positive terminal coupled to a reference voltage (e.g., 4.8V), a negative terminal coupled to the source electrode of output transistor 18 and the $V_{OUT}$ node, and an output for providing a control signal (SW). SW signal is either at a high logic level or a low logic level based on the voltage at the $V_{OUT}$ node. The reference voltage can be provided by any voltage source, such as a band gap reference generator or a potential meter. When the voltage at the $V_{OUT}$ node is in a first predetermined relationship with the reference voltage (e.g., 4.8V), the SW signal is asserted. In this example, the first predetermined relationship is when the voltage at $V_{OUT}$ is less than 4.8V. When the voltage at $V_{OUT}$ drops below 4.8V (e.g., when the voltage at $V_{OUT}$ is 4.7V), the SW signal transitions to a logic low level. Otherwise, comparator 24 provides a SW signal that is at a high logic level.

SHORT PROTECTION AND CURRENT FOLDBACK CIRCUIT (SPCFC) 28

Linear voltage regulator 10 further includes short protection and current foldback circuit (SPCFC) 28 (also referred to hereinafter simply as "current protection circuit") of the present invention that protects linear voltage regulator 10 from high current conditions. The terms "high current condition" or "over-current" as used herein refers to a current level that is unacceptable to output transistor 18, external load 14, or both. This over-current or high current is defined by the design specifications of external load 14 or output transistor 18 and can vary depending on the particular application. For example, a designer of external load 14 can specify a range of acceptable currents and set a maximum acceptable current level.

If external load 14 or transistor 18 continues to be subject to the overcurrent, damage to load 14 or transistor 18 results. Accordingly, it is important for the present invention to detect these overcurrent or high current conditions and to selectively reduce the level of the output current to acceptable levels.

SPCFC 28 detects over-current or high current conditions and selectively changes, varies, or otherwise modifies the output current of transistor 18 from a normal current level to a foldback current level. SPCFC 28 includes a first input for receiving the control signal (SW) from comparator 24, a second input coupled to load 14 at the $V_{OUT}$ node for receiving the output voltage, and an output coupled to the gate electrode of transistor 18 for draining gate charge from the gate electrode of transistor 18 during a high current condition.

SPCFC 28 can include a switch circuit 30, a drainage circuit controller 34, a gate charge drainage circuit 38, a foldback current adjuster 44, and a voltage generation circuit 48.

Voltage generation circuit 48 includes an input for receiving an predetermined operation voltage, such as $V_{DD}$, and in response thereto generates a first reference voltage (e.g., $V_{PI}$) and a second reference voltage (e.g., $V_{PP}$). Voltage generation circuit 48 can be a voltage pump whose construction and use are well known by those of ordinary skill in the art.

As a non-limiting example, in one embodiment the predetermined operation voltage (e.g., $V_{DD}$) can be approximately 5V+/-10%; the first reference voltage (e.g., $V_{PI}$) can approximately in the range of 7V to 12V, and second reference voltage (e.g., $V_{PP}$) can approximately in the range of 8V to 13V. It is noted that other voltages and voltage ranges can be selected for $V_{DD}$, $V_{PI}$, and $V_{PP}$, and voltage generation circuit 48 can be configured to provide voltages to suit a particular application.

Figure 3:
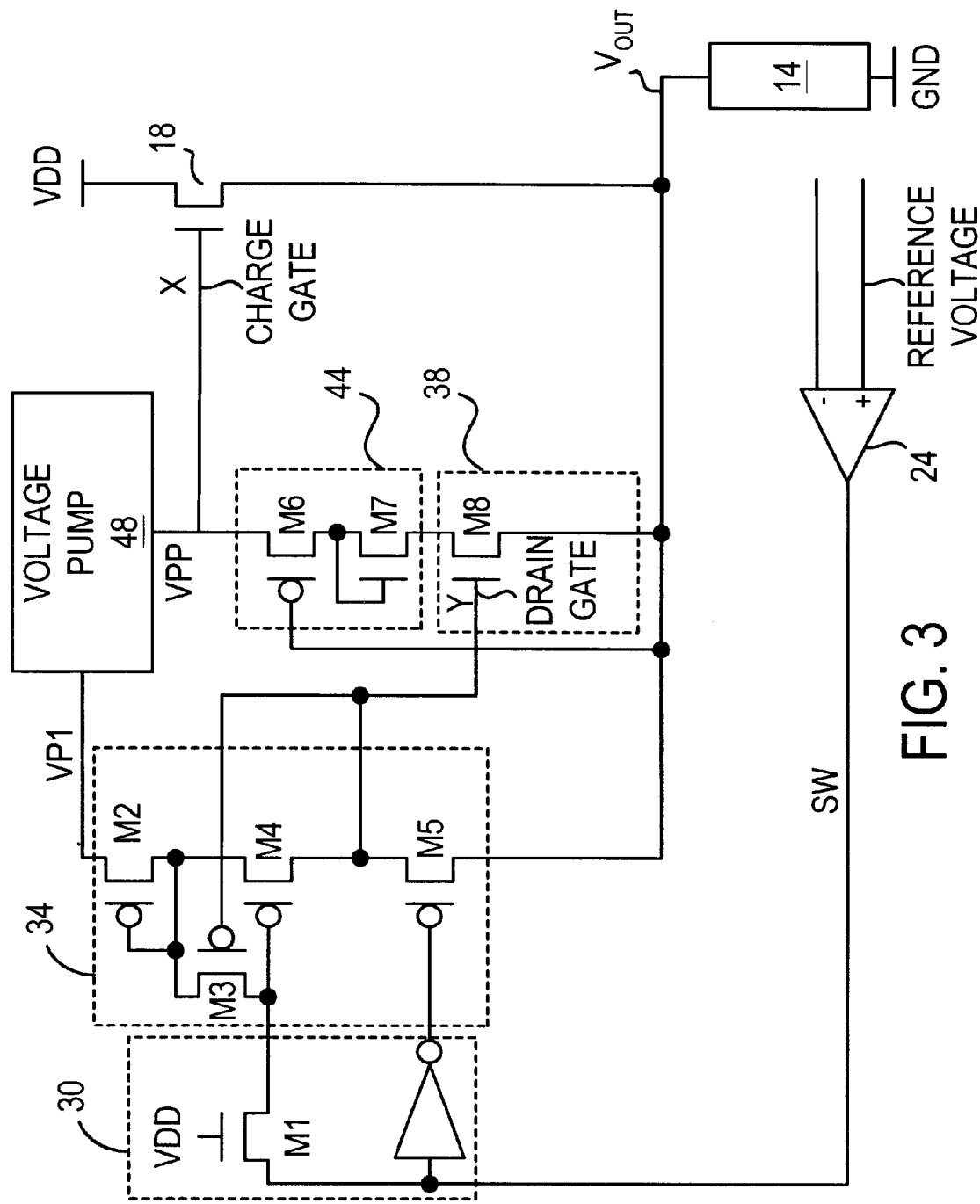
FIG. 3 is a circuit diagram illustrating in greater detail the linear voltage regulator and the current protection circuit of FIG. 2.

FIG. 3 illustrates in greater detail the linear voltage regulator of FIG. 2. Switch circuit 30 can include a pass transistor MI having a drain electrode coupled to the output of comparator 24, a gate electrode coupled to a predetermined voltage (e.g., $V_{DD}$), and a source electrode coupled to drainage circuit controller 34 for providing a first output signal. Switch circuit 30 can further include an inverter having a first electrode coupled to the output of comparator 24 and a second electrode coupled to drainage circuit controller 34 for providing a second output signal.

It will be understood that switch circuit 30 can be configured in alternative ways and using different circuits. It is important that switch circuit 30 receives a SW signal and provides a first output signal at a high logic level and a second output signal at a low logic level, or a first output signal at a low logic level and a second output signal at a high logic level based on the logic level of the received SW signal.

Drainage Circuit Controller 34 can include a first input for receiving the first output of switch circuit 30, a second input for receiving the second output of switch circuit 30, a third input for receiving $V_{PI}$, and an output coupled to the $V_{OUT}$ node. Drainage Circuit Controller 34, processes these inputs and provides a control signal to the gate charge drainage circuit 38. In one example, drainage circuit controller 34 includes four transistors (M2, M3, M4, M5) configured as shown in FIG. 3. The operation of these transistors will be described in greater detail hereinafter.

During normal operation, acceptable current levels flows through output transistor 18, and the SW signal is at a logic high level which causes switch circuit 30 to turn transistor M4 off and transistor M5 on. When transistor M5 is on, the gate electrode of transistor M8 is subject to a voltage of the $V_{OUT}$ node, which in one example is in the range of 4.8V to 5V. During normal operation, the current through output transistor is a predetermined output current, such as a current of approximately 500 mA, that is delivered to load 14.

When transistor M5 is on, the voltage at the $V_{OUT}$ node is reflected at the gate of transistor M8 thereby causing transistor M8 to turn off and transistor M3 to turn on. It is noted that when the signal SW is asserted (i.e., at a high voltage level), transistor M4 turns off. In addition, the gate of transistor M4 is subject to a voltage of approximately $V_{PI}$ when the current path, established by transistor M2 and transistor M3, is turned on. When transistor M3 turns on, it reinforces the turn off of transistor M4.

During high current conditions, the voltage at the $V_{OUT}$ node is rapidly dropping to a predetermined threshold voltage, such as 4.6V. High current conditions are also referred to hereinafter as overcurrent or short circuit conditions. In one example, there is a voltage drop of approximately 400 mV across the drain and source electrode of output transistor 18, and a current of approximately 1A through transistor 18.

Foldback current adjuster 44 can include transistor M6 and transistor M7, and gate charge drainage circuit 38 can include transistor M8. The sizes of transistors M7 and M8 can be predetermined to set a particular foldback current level. Each transistor includes a drain electrode, a gate electrode, and a source electrode. Transistor M6 includes a source electrode that is coupled to the gate electrode of output transistor 18, a gate electrode that is coupled to the source electrode of output transistor 18 (also referred to as the $V_{OUT}$ node), and a drain electrode.

Transistor M7 includes a source electrode, a gate electrode, and a drain electrode coupled to the gate electrode of transistor M7 and the drain electrode of transistor M6. Transistor M8 includes a drain electrode that is coupled to the source electrode of transistor M7, a gate electrode that is coupled to the gate electrode of transistor M3, the drain electrode of transistor M4, and the source electrode of transistor M5, and a source electrode that is coupled to the source electrode of output transistor 18 (also referred to as the $V_{OUT}$ node).

The present invention detects high current conditions and selectively controls transistor 18 to change the output current from normal levels to a foldback current level. During short circuit conditions, the voltage at the $V_{OUT}$ node drops below the reference voltage thereby causing comparator 24 to provide an SW signal at a low logic level. The de-asserted SW signal causes the first output of switch circuit 30 to be at a low logic level and the second output of switch circuit 30 to be at a high logic level. The first output signal of switch circuit 30 turns on transistor M4, and the second output signal turns off transistor M5, thereby causing the node at the gate electrode of transistor M8 to transition to a voltage that is approximately $V_{PI}$.

Accordingly, transistor M8 is turned on, and a current path is provided through transistor M6, M7, and M8 to drain charge from the gate electrode of output transistor 18 to the $V_{OUT}$ node. For example, when $V_{PP}$ is 12V, and the current path (transistors M6, M7, and M8) is turned on, the voltage at the X node (i.e., gate electrode of transistor 18), which is approximately one threshold voltage drop above the potential (e.g., 0.7V) at the $V_{OUT}$ node, is reflected at the $V_{PP}$ node thereby throttling the amount of predetermined current flowing through output transistor 18.

Figure 4:
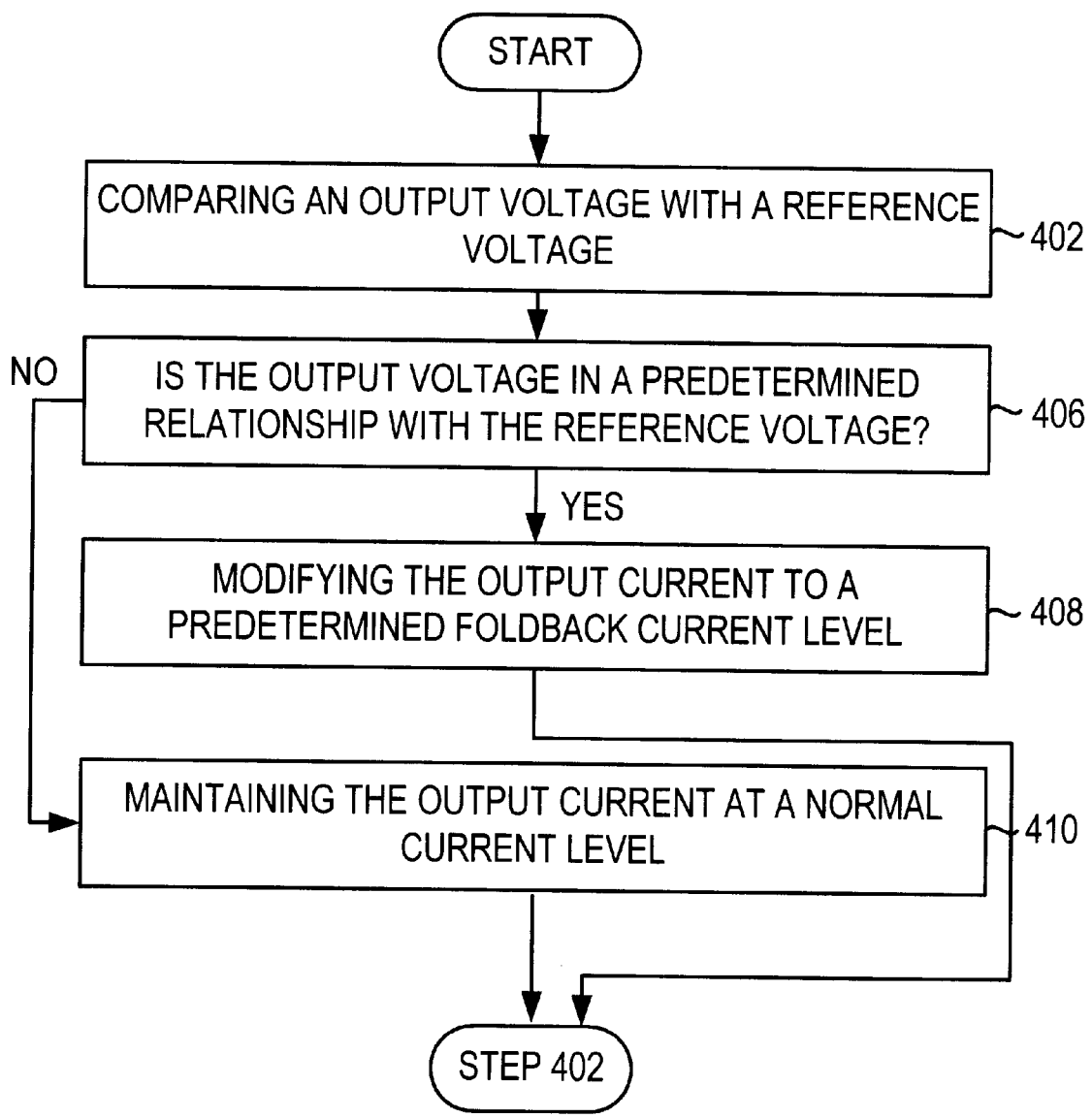
FIG. 4 is a flowchart illustrating the steps performed by the current protection circuit in accordance with one embodiment of the present invention.

FIG. 4 is a flowchart illustrating the steps performed by the current protection circuit in accordance with one embodiment of the present invention. In step 402, an output voltage is compared with a reference voltage. Step 402 can include the step of receiving the reference voltage and the output voltage. In step 406, a determination is made whether the output voltage is in a predetermined relationship with the reference voltage. In one embodiment, the determination is whether the output voltage is less than the reference voltage. If yes, in step 408, the output current is automatically adjusted or modified to a predetermined foldback current level. Otherwise, in step 410, the output current is maintained at a normal current level. Processing then proceeds to step 402.

In one embodiment, step 408 includes the step of selectively decreasing the voltage at a gate electrode of a transistor 18 so that the current through transistor 18 is decreased. Decreasing the voltage at the gate electrode of transistor 18 can be accomplished by utilizing foldback gate charge drainage circuit 38 and current adjuster 44.

Figure 5:
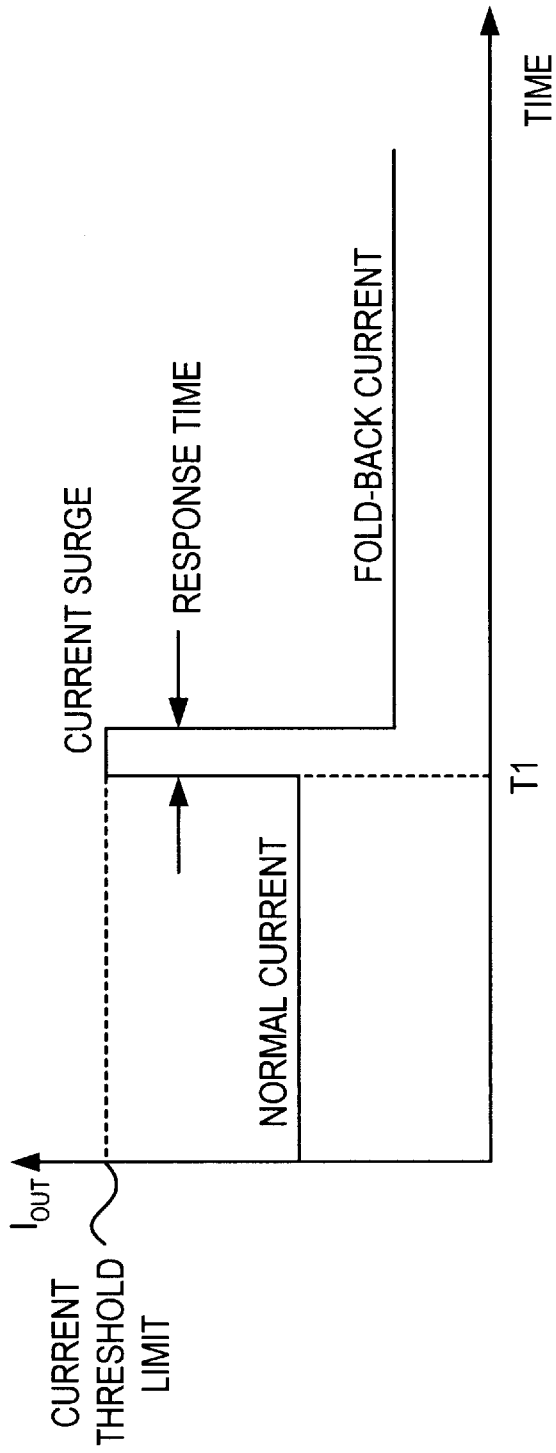
FIG. 5 is a graph illustrating the output current with respect to time of the current protection circuit in accordance with one embodiment of the present invention.
Figure 6:
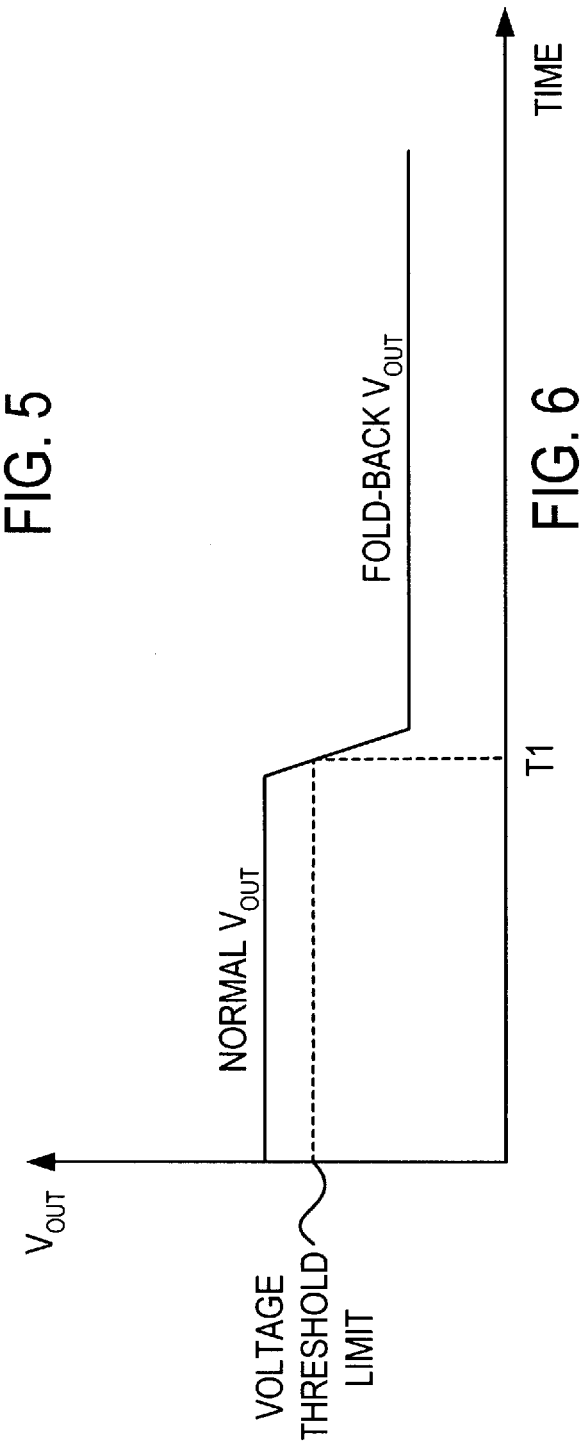
FIG. 6 is a graph illustrating the output voltage with respect to time of the current protection circuit in accordance with one embodiment of the present invention.

FIG. 5 is a graph illustrating the output current with respect to time of the current protection circuit in accordance with one embodiment of the present invention. The vertical axis represents the output current at the $I_{OUT}$ node. FIG. 6 is a graph illustrating the output voltage with respect to time of the current protection circuit in accordance with one embodiment of the present invention. The vertical axis represents the output voltage at the $V_{OUT}$ node.

At time t1, there is a current surge due to external short circuit conditions. If the voltage at the $V_{OUT}$ node dips below a pre-determined voltage threshold, which in one example is 4.7V, the output current our is switched to a predetermined foldback current level. The present invention adjusts the output current $I_{OUT}$ to the foldback level in order to protect the down stream circuit (i.e., the circuit that is connected to the regulator). The current levels, voltage levels, and response time can be varied to suit a particular application.

The foregoing description has provided a non-limiting example of the present invention. It will be appreciated that the present invention will find useful applications in any electronic device that employs a linear voltage regulator and which requires current protection. For example, the present invention can be used to protect notebook computers, desktop computers, battery adapters, and voltage conversion circuits. Also, the present invention can be implemented in a linear regulator for use with USB peripheral devices.

In addition, the various circuit modules comprising voltage pump 40, comparator 24, switch circuit 60, gate charge drainage circuit 70, drainage circuit controller 80, and fold-back current adjuster 90, may be substituted by similar circuits while still using the same concepts of this present invention.

By limiting the current to a foldback current during over-current conditions, the present invention prevents high current conditions. Accordingly, the present invention also reduces or eliminates thermal runaway of transistor 18 and the circuit, prevents the fusing of bond wires, and reduces the risk of electro-migration.

Moreover, it will be appreciated that various modifications and changes may be made thereto without departing from the broader spirit and scope of the invention as set forth in the appended claims. For example, the various transistors described in the embodiment of FIG. 3 may, of course, be opposite type transistors (e.g., use of PMOS transistors instead of NMOS transistors and vice-versa) or may be transistors using other technologies, where the MOS transistors may be bipolar transistors and vice-versa.

What is claimed is:

1. A current protection circuit for coupling to an output node of an output transistor having an output voltage comprising:

a) a first input for coupling to the output node and for receiving the output voltage and generating a control signal;

b) an second input for receiving the control signal; and c) an output for coupling to a charge gate node of the output transistor;

d) a switch circuit for receiving the control signal and responsive thereto for generating a first output signal and a second output signal;

e) a drainage circuit controller, coupled to the switch circuit, for receiving the first output signal and the second output signal and responsive thereto for generating a drainage control signal;

f) a gate charge drainage circuit coupled to the drainage circuit controller for receiving the drainage control signal, to the output node for detecting changes in the output voltage, and to the output for selectively affecting the voltage at the output based on the drainage control signal and the voltage at the output node; and g) a voltage pump having a first input for receiving a first predetermined voltage, a first output coupled to the drainage circuit controller for providing a second predetermined voltage, and a second output coupled to the gate charge drainage circuit for providing a third predetermined voltage.

2. The protection circuit as set forth in claim 1, further comprising a foldback current adjuster having an input coupled to the second output of the voltage pump for receiving the third predetermined voltage, an output coupled to the gate charge drainage circuit, and a current path; wherein the foldback current adjuster selectively adjusts the current flowing through the current path.

3. The protection circuit as set forth in claim 1, wherein the switch circuit includes an inverter having a first electrode for receiving the control signal and a second electrode; and a first transistor having a first electrode for receiving the control signal, a second electrode for receiving a predetermined voltage, and a third electrode.

4. The protection circuit as set forth in claim 3, wherein the drainage circuit controller circuit includes a second transistor having a source electrode coupled to the first output of the voltage pump, a gate electrode, and a drain electrode;

a third transistor having a source electrode coupled to the gate electrode and drain electrode of the second transistor, a gate electrode, and a drain electrode coupled to the third electrode of the first transistor;

a fourth transistor having a source electrode coupled to the source electrode of the third transistor, a gate electrode coupled to the third electrode of the first transistor, and a drain electrode coupled to the gate electrode of the third transistor; and a fifth transistor having a source electrode coupled to the drain electrode of the fourth transistor, a gate electrode coupled to the second electrode of the inverter, and a drain electrode coupled to output node.

5. The protection circuit as set forth in claim 4, wherein the gate charge drainage circuit includes an eighth transistor having a drain electrode coupled to the second output of the voltage pump, a gate electrode coupled to the source electrode of the fifth transistor, and a source electrode coupled to the output node.

6. The protection circuit as set forth in claim 1, wherein the foldback current adjuster includes a sixth transistor having a source electrode coupled to the second output of the voltage pump, a gate electrode coupled to the output node, and a drain electrode; and a seventh transistor having a drain electrode coupled to drain electrode of the sixth transistor, a gate electrode coupled to the drain electrode of the seventh transistor, and a source electrode coupled to the output node.

7. A current protection circuit for coupling to an output node of an output transistor having an output voltage comprising:

a) a first input for coupling to the output node and for receiving the output voltage and generating a control signal;

b) an second input for receiving the control signal; and c) an output for coupling to a charge gate node of the output transistor;

d) a switch circuit for receiving the control signal and responsive thereto for generating a first output signal and a second output signal;

e) a drainage circuit controller, coupled to the switch circuit, for receiving the first output signal and the second output signal and responsive thereto for generating a drainage control signal; and f) a gate charge drainage circuit coupled to the drainage circuit controller for receiving the drainage control signal, to the output node for detecting changes in the output voltage, and to the output for selectively affecting the voltage at the output based on the drainage control signal and the voltage at the output node.

* * * * *